United States Patent
Heng et al.

(10) Patent No.: US 10,147,700 B2
(45) Date of Patent: Dec. 4, 2018

(54) FLEXIBLE WINDOW CLAMP

(71) Applicant: Carsem (M) Sdn. Bhd., Ipoh (MY)

(72) Inventors: Wong Chee Heng, Ipoh (MY); Yee Kwong Cheong, Ipoh (MY); Regis Arul Raj, Ipoh (MY)

(73) Assignee: Carsem (M) Sdn. Bhd., Ipoh (MY)

( * ) Notice: Subject to any disclaimer, the term of this patent is extended or adjusted under 35 U.S.C. 154(b) by 0 days.

(21) Appl. No.: 15/440,949

(22) Filed: Feb. 23, 2017

(65) Prior Publication Data
US 2017/0256518 A1 Sep. 7, 2017

(30) Foreign Application Priority Data
Mar. 1, 2016 (MY) ................................ 2016700711

(51) Int. Cl.
*B23K 37/00* (2006.01)
*B23K 37/04* (2006.01)
*H01L 23/00* (2006.01)

(52) U.S. Cl.
CPC .............. *H01L 24/78* (2013.01); *H01L 24/48* (2013.01); *H01L 2224/48247* (2013.01); *H01L 2224/78705* (2013.01); *H01L 2224/78986* (2013.01)

(58) Field of Classification Search
CPC .......................... B23K 20/004; B23K 2201/40
USPC ............... 228/212, 213; 269/42, 56, 63, 903
See application file for complete search history.

(56) References Cited

U.S. PATENT DOCUMENTS

| | | | |
|---|---|---|---|
| 5,035,034 A * | 7/1991 | Cotney | H01L 21/67144 228/180.5 |
| 5,193,733 A | 3/1993 | You | |
| 6,062,459 A * | 5/2000 | Sabyeying | B23K 20/004 228/4.5 |
| 6,105,846 A * | 8/2000 | Evers | B23K 20/004 228/1.1 |
| 6,861,733 B2 | 3/2005 | Kek | |
| 6,921,017 B2 | 7/2005 | Evers et al. | |
| 7,131,568 B2 | 11/2006 | Ball | |
| 7,240,820 B2 | 7/2007 | Duan et al. | |
| 7,578,425 B2 * | 8/2009 | Kampschreur | H01L 24/78 198/736 |
| 7,927,923 B2 | 4/2011 | James | |
| 8,720,767 B2 | 5/2014 | Byars et al. | |
| 8,964,404 B2 | 2/2015 | Poetzinger | |
| 9,077,092 B2 | 7/2015 | Kraemer et al. | |
| 2014/0217152 A1 * | 8/2014 | Chuang | H01L 24/78 228/4.5 |

FOREIGN PATENT DOCUMENTS

CN 201729899 2/2011

OTHER PUBLICATIONS

Rahman, "A Computer-aided Process Planning System for the Manufacture of Lead Frame Wrebonding Clamping Assembly", 2005, 7 pages.

* cited by examiner

Primary Examiner — Erin B Saad
(74) Attorney, Agent, or Firm — Kilpatrick Townsend & Stockton LLP

(57) ABSTRACT

A window clamp includes a center portion, side portions, and flexible members. The side portions are arranged on opposing sides of the center portion. The flexible members extend between the side portions and the center portion. The flexible members allow movement of the center portion in X, Y, and Z directions independent of movement of the side portions.

20 Claims, 2 Drawing Sheets

FLEXIBLE WINDOW CLAMP

CROSS REFERENCE TO RELATED APPLICATIONS

This application claims priority to Malaysian Patent Application No. PI 2016700711, filed Mar. 1, 2016, the entire contents of which are incorporated herein by reference for all purposes.

FIELD OF THE INVENTION

Embodiments described herein relate in general to integrated circuit (IC) packaging, and more particularly, to window clamps that may be used in IC packaging to hold leadframes during wirebonding processes. As used herein, the term leadframe may include the frame as well as the die paddles and/or leads.

BACKGROUND

During wirebonding processes, a leadframe must be held motionless while wires are attached between the small contacts of an integrated circuit and the leads of the leadframe. This typically involves clamping the leadframe between a window clamp and a support or hot plate. The window clamp is pressed against the leadframe, and the pressure keeps the leadframe from moving. Window clamps typically have one or more openings (or windows) that align with the die of the leadframe and through which the die and leads can be accessed during the wirebonding process to attach the wires.

Keeping the leadframe perfectly motionless can be challenging. Small deviations in parallelism between the support, leadframe, and/or window clamp can result in imperfect clamping that may allow the leadframe to move during wirebonding processes. Imperfect clamping can also be caused by a number of other factors such as misalignment of the window clamp and leadframe, misalignment of the window clamp and clamping plate, uneven pressure applied to sides of the window clamp, uneven surfaces, and uneven thickness of the leadframe. Imperfect clamping can lead to wirebonding defects that can reduce yield and impact reliability.

SUMMARY

Some embodiments described herein provide flexible window clamps that enable improved clamping. The improved clamping can reduce or prevent movement of a leadframe during a wirebonding process. For example, in accordance with an embodiment, a window clamp for holding a leadframe during a wirebonding process includes a center portion, side portions, and flexible members. The center portion has one or more windows extending therethrough. The one or more windows are arranged to expose one or more die of the leadframe when the window clamp is placed on the leadframe during the wirebonding process. The side portions are arranged on opposing sides of the center portion. The side portions each provide a rigid structure for pressing the window clamp against the leadframe during the wirebonding process. The flexible members extend between the side portions and the center portion. The flexible members allow movement of the center portion in X, Y, and Z directions independent of movement of the side portions.

In an embodiment, the flexible members allow elastic movement of the center portion in the X, Y, and Z directions.

In some embodiments, the flexible members are W-shaped. In other embodiments, the flexible members are V-shaped. In yet other embodiments, the flexible members are curve-shaped and extend between one of the side portions and the center portion.

In some embodiments, the flexible members consist of the same material as the side portions and the center portion. In other embodiments, the flexible members consist of a different material than the side portions and the center portion.

In some embodiments, a plurality of the flexible members extend between each of the side portions and the center portion. In other embodiments, only one flexible member extends between each of the side portions and the center portion In another embodiment, a plurality of the flexible members extend between each of the side portions and the center portion, and each of the plurality of flexible members that is coupled to one of the side portions is separated from an adjacent flexible member that is coupled to the same side portion by a space.

In some embodiments, a thickness of the flexible members is less than a thickness of the side portions. In other embodiments, a thickness of the flexible members is the same as a thickness of the side portions.

Another embodiment provides a window clamp for holding a leadframe during a wirebonding process. The window clamp includes a center portion, a first side portion, and a second side portion. The first side portion is disposed on a first side of the center portion and coupled to the center portion by one or more first flexible members. The one or more first flexible members each have a curved-shape. The second side portion is disposed on a second side of the center portion opposite the first side. The second side portion is coupled to the center portion by one or more second flexible members. The one or more second flexible members each have a curved-shape. Each of the one or more first flexible members and the one or more second flexible members may have a lower modulus than either the side first side portion, the second side portion, or the center portion.

In an embodiment, the one or more first flexible members are mirror images of the one or more second flexible members along an axis extending on a major surface of the center portion and evenly separating the first side portion from the second side portion.

In another embodiment, adjacent corners of the first side portion and the center portion are not coupled, and adjacent corners of the second side portion and the center portion are not coupled.

Yet another embodiment provides a window clamp for holding a leadframe during a wirebonding process. The window clamp includes a center portion, side portions, and flexible members. The side portions are each disposed on an opposing side of the center portion. The flexible members extend between each side portion and the center portion and allow movement of the center portion independent of movement of the side portions. Adjacent corners of the side portions and the center portion are not coupled.

Numerous benefits may be realized using embodiments described herein over conventional window clamps. For example, in some embodiments, window clamps are provided that include flexible members extending between side portions and a center portion. The side portions can provide rigid structures for pressing the window clamp against the leadframe during the wirebonding processes. The center portion contacts the leadframe during the wirebonding process and may include one or more windows to expose the die of the leadframe. The flexible members may allow movement of the center portion in X, Y, and Z directions independent of movement of the side portions. This can improve contact between the center portion and the leadframe to reduce or prevent movement of the leadframe. This can lower wirebonding defects and increase yield. In other embodiments, the flexible members can have a lower modulus than either the side portions or the center portion. This can also improve contact between the center portion and the leadframe. Depending on the embodiment, one or more of these features may exist. These and other embodiments, along with many other advantages and benefits, are described throughout the specification.

DETAILED DESCRIPTION

Embodiments described herein provide flexible window clamps that enable improved clamping for reducing or preventing movement of leadframes during wirebonding processes. The improved clamping can be provided using flexible members that allow movement of a center portion of the flexible window clamp independent of movement of side portions of the flexible window clamp. The center portion can contact the leadframe and provide one or more windows for exposing die and leads of the leadframe, and the side portions can be for pressing the flexible window clamp against the leadframe.

Figure 1:
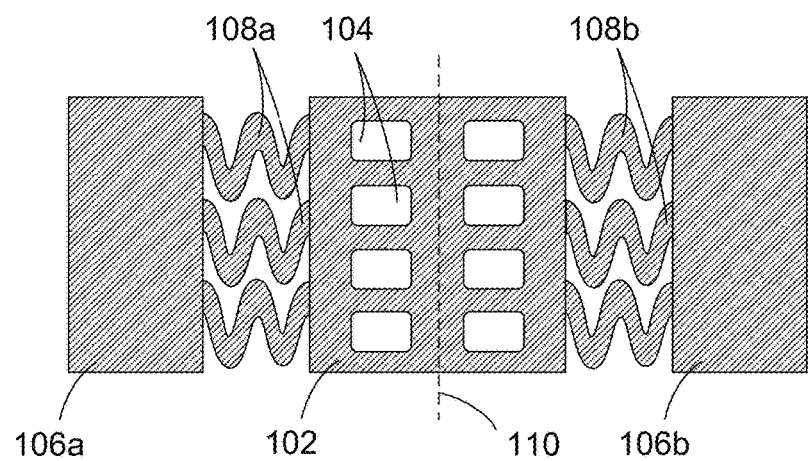
FIG. 1 is a simplified top view of a flexible window clamp in accordance with an embodiment.

FIG. 1 is a simplified top view of a flexible window clamp in accordance with an embodiment. The flexible window clamp includes a center portion 102 that has one or more windows 104. In this example the center portion 102 includes eight windows 104. A size, shape, and number of the one or more windows 104 is determined based on the particular leadframe in accordance with known techniques. Each window exposes one or more die and associated leads when the flexible window clamp is placed on the leadframe during a wirebonding process.

The flexible window clamp also includes side portions 106a, 106b arranged on opposing sides of the center portion 102. The side portions 106a, 106b provide rigid structures for pressing the window clamp against the leadframe during the wirebonding process.

The side portions 106a, 106b are coupled to the center portion 102 by flexible members 108a, 108b. The flexible members 108a, 108b allow movement of the center portion 102 independent of movement of the side portions 106a, 106b. In some embodiments, the flexible members 108a, 108b allow movement of the center portion 102 in X, Y, and Z directions independent of movement of the side portions 106a, 106b. This allows the window clamp to self-balance so that the center portion 102 firmly clamps the leadframe despite any non-parallelism between the window clamp and the leadframe.

In FIG. 1, the flexible members 108a are mirror images of the flexible members 108b along an axis 110 extending on a top surface of the center portion 102. In this example, the top surface is a major surface of the center portion 102 because an area of the top surface is greater than an area of the side surfaces (see, for example, the side views of FIGS. 2-3). The axis 110 evenly separates the side portion 106a from the side portion 106b. Although not shown in this example, in some embodiments the flexible members 106a, 106b may be mirror opposites along the axis 110.

Figure 2:
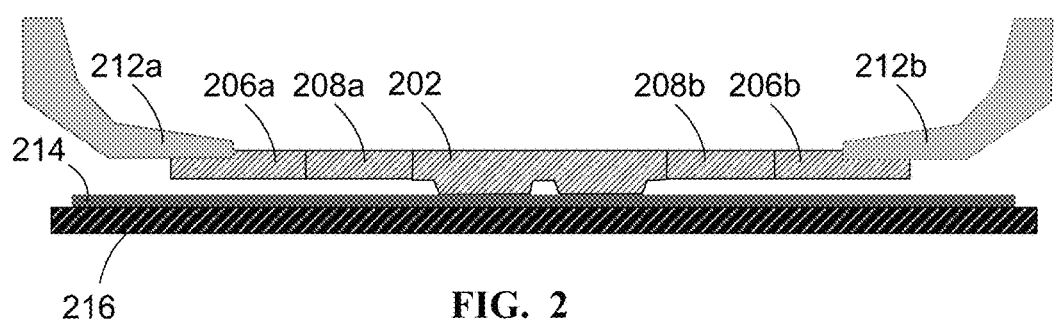
FIG. 2 is a simplified side view of a leadframe held between a flexible window clamp and a support in accordance with an embodiment.

FIG. 2 is a simplified side view of a leadframe held between a flexible window clamp and a support by a clamping plate in accordance with an embodiment. This figure shows portions 212a, 212b of the clamping plate that provide force on side portions 206a, 206b to hold leadframe 214 firmly against support 216 during a wirebonding process. Although not shown in detail, the leadframe 214 may include a plurality of units that each include a die surrounded by a plurality of leads. The die may be attached to a die paddle or an adhesive tape, and the leads may be attached to connecting bars of the leadframe 214. The die paddle (if included) may be attached to the connecting bars by tie bars. In some embodiments, the support 216 may be a hotplate that is used to heat the leadframe 214 during the wirebonding process. The support 216 and portions 212a, 212b may be part of a larger wirebonding apparatus that includes numerous other parts for performing wirebonding processes.

In this example, flexible member 208a connects the side portion 206a to center portion 202, and flexible member 208b connects the side portion 206b to the center portion 202. This side view shows that the flexible members 208a, 208b are each approximately the same thickness as their corresponding side portions 206a, 206b.

In some embodiments, a padding material (e.g., an adhesive tape, rubber coating, or the like) may be applied to a bottom surface of the window clamp to cushion the force between the window clamp and the leadframe and to mitigate minor instances of non-parallelism.

Figure 3:
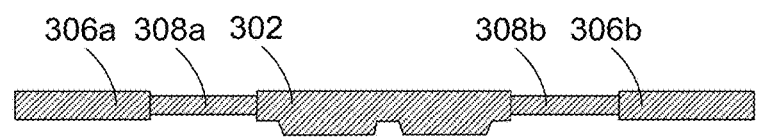
FIG. 3 is a simplified side view of a flexible window clamp in accordance with an embodiment.

FIG. 3 is a simplified side view of a flexible window clamp in accordance with an embodiment. In this example, flexible member 308a connects side portion 306a to center portion 302, and flexible member 308b connects side portion 306b to the center portion 302. This side view shows that the flexible members 308a, 308b are each thinner than their corresponding side portions 306a, 306b.

In some embodiments, the window clamp may be made from a single piece of solid metal (e.g., steel) so that the side portions, the flexible members, and the center portion all consist of the same material. The flexible members and the windows in the center portion may be formed by removing portions of the metal. The flexible members may be formed in a shape that enables them to be more flexible than either the side portions or the center portion.

The flexible members may be approximately the same thickness as their corresponding side portions, or the flexible members may be thinner than their corresponding side portions to increase flexibility of the flexible members. In either case the flexible members may allow elastic movement of the center portion in X, Y, and Z directions independent of movement of the side portions. The flexible members may have a lower modulus (or lower resistance to elastic deformation) than either the side portions or the center portion to even out any variations in clamping force between the window clamp and leadframe.

In other embodiments, the flexible members may be made of a different material than either the side portions or the center portion (e.g., a different type of metal). In this case, the flexible members may consist of a material that has a lower modulus than the material of the side portions and the center portion.

Figure 4:
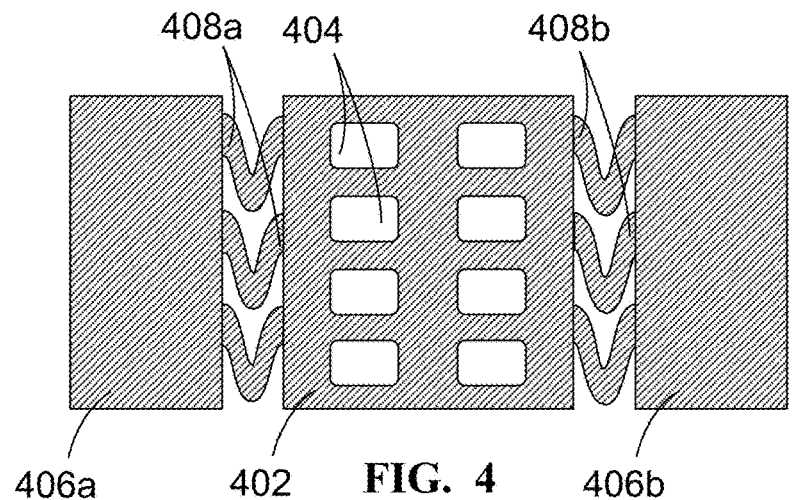
FIGS. 4-6 are simplified top views of flexible window clamps in accordance with some embodiments.
Figure 5:
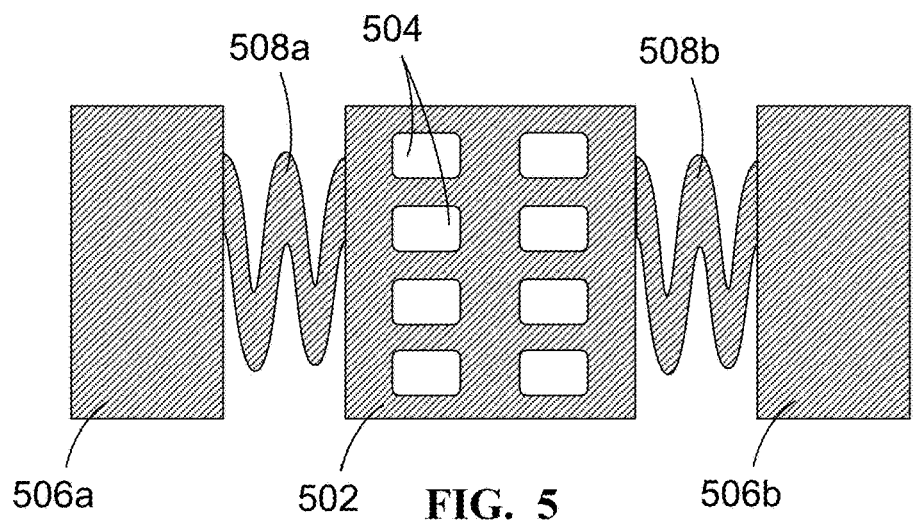
Figure 6:
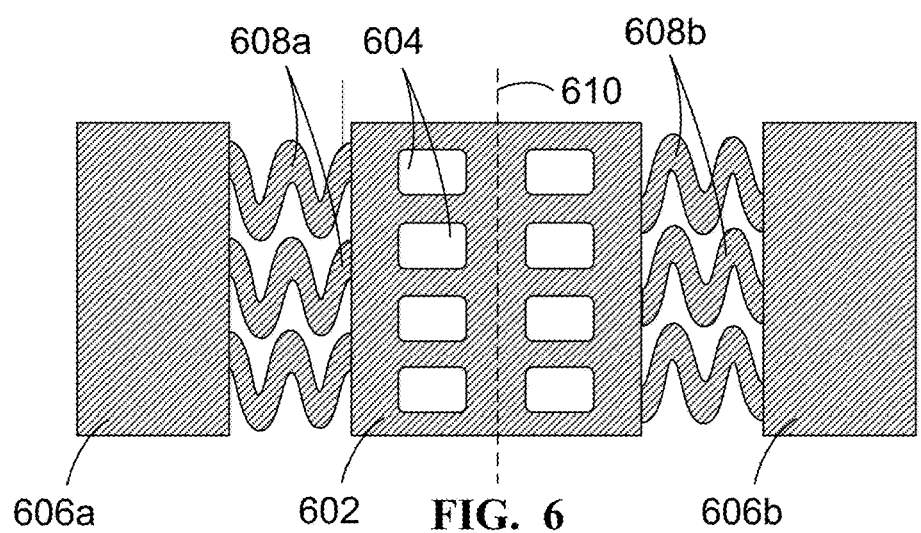

FIGS. 4-6 are simplified top views of flexible window clamps in accordance with some embodiments. FIG. 4 shows a flexible window clamp that includes side portions 406a, 406b coupled to a center portion 402 by flexible members 408a, 408b. The center portion 402 includes one or more windows 404 to expose the die of a leadframe during a wirebonding process. In this example, the flexible members 408a, 408b are V-shaped, whereas in the example shown in FIG. 1, the flexible members 108a, 108b are W-shaped. The flexible members are not limited to these particular shapes, and may include other shapes that allow elastic movement of the center portion independent of movement of the side portions. As an example, the flexible members may be curve-shaped, with each curve-shaped member extending between one of the side portions and the center portion. Also, the flexible members are not limited to any particular length. In some embodiments, adjacent corners of the side portions and the center portion are not coupled to increase flexibility of the flexible members and to facilitate movement of the center portion independent of the side portions.

FIG. 5 shows a flexible window clamp that includes side portions 506a, 506b coupled to a center portion 502 by flexible members 508a, 508b. The center portion 502 includes one or more windows 504 to expose the die of a leadframe during a wirebonding process. In this example, the side portion 506a is coupled to the center portion 502 by a single flexible member 508a, and the side portion 506b is coupled to the center portion 502 by a single flexible member 508b. This is in comparison to the example shown in FIG. 4, where the flexible member 408a includes three members and the flexible member 408b includes three members. In FIG. 4, each of the members of flexible member 408a are separated from adjacent members by a space, and each of the members of flexible member 408b are separated from adjacent members by a space. The flexible members are not limited to these particular examples, however, and may include any number and/or shape of members depending on the desired modulus of the flexible members. In embodiments where the flexible members each include a plurality of members, the spacing between the members may be determined based on the desired modulus.

FIG. 6 shows a flexible window clamp that includes side portions 606a, 606b coupled to a center portion 602 by flexible members 608a, 608b. The center portion 602 includes one or more windows 604 to expose the die of a leadframe during a wirebonding process. In this example, the flexible members 608a are mirror opposites of the flexible members 608b along axis 610. The axis 610 evenly separates the side portion 606a from the side portion 606b.

While the present invention has been described in terms of specific embodiments, it should be apparent to those skilled in the art that the scope of the present invention is not limited to the embodiments described herein. For example, features of one or more embodiments may be combined with one or more features of other embodiments without departing from the scope of the invention. The specification and drawings are, accordingly, to be regarded in an illustrative rather than a restrictive sense. Thus, the scope of the present invention should be determined with reference to the appended claims along with their full scope of equivalents.

What is claimed is:

1. A window clamp for holding a leadframe during a wirebonding process, comprising:

a center frame portion having a top surface, a bottom surface, and an outer edge, the outer edge extending between the top surface and the bottom surface and around a circumference of the center frame portion, wherein a plurality of windows extend from the top surface to the bottom surface through the center frame portion, and each of the plurality of windows are surrounded by an inner edge of the center frame portion, the plurality of windows arranged to expose one or more die of the leadframe when the window clamp is placed on the leadframe during the wirebonding process;

side portions each having a top surface, a bottom surface, and a side surface and each side portions arranged on an opposing side of the center frame portion, the side portions each providing a rigid structure for pressing the window clamp against the leadframe during the wirebonding process;

flexible members each extending between the side surface of each of the side portions and the outer edge of the center frame portion so that the flexible members fully isolate the side portions from the center frame portion, the flexible members allowing movement of the center frame portion in X, Y, and Z directions independent of movement of the side portions when the side portions are in contact with a clamping plate exerting a force on the side portions.

2. The window clamp of claim 1 wherein the flexible members allow elastic movement of the center frame portion in the X, Y, and Z directions.

3. The window clamp of claim 1 wherein the flexible members are W-shaped.

4. The window clamp of claim 1 wherein the flexible members are V-shaped.

5. The window clamp of claim 1 wherein the flexible members each comprise a plurality of curve-shaped members, each curve-shaped member extending between the side surface of each of the side portions and the outer edge of the center frame portion.

6. The window clamp of claim 1 wherein the flexible members consist of the same material as the side portions and the center frame portion.

7. The window clamp of claim 1 wherein the flexible members consist of a different material than the side portions and the center portion.

8. The window clamp of claim 1 wherein a plurality of the flexible members extend between the side surface of each of the side portions and the center frame portion.

9. The window clamp of claim 1 wherein only one of the flexible members extends between the side surface of each of the side portions and the center frame portion.

10. The window clamp of claim 1 wherein a plurality of the flexible members extend between the side surface of each of the side portions and the center frame portion, and each of the plurality of the flexible members that is coupled to one of the side portions is separated from an adjacent flexible member that is coupled to the same side portion by a space.

11. The window clamp of claim 1 wherein a thickness of the flexible members is the same as a thickness of the side portions.

12. A window clamp for holding a leadframe during a wirebonding process, comprising:

a center frame portion comprising a top surface, a bottom surface, and an outer edge, the outer edge extending between the top surface and the bottom surface and around a circumference of the center frame portion, wherein a plurality of windows extend from the top surface to the bottom surface through the center frame portion, and each of the plurality of windows are surrounded by an inner edge of the center frame portion;

a first side portion having a first top surface, a first bottom surface, and a first side surface, the first side portion coupled to the outer edge of the center frame portion by one or more first flexible members, the one or more first flexible members each having a curved-shape;

a second side portion having a second top surface, a second bottom surface, and a second side surface, the second side portion coupled to the outer edge of the center frame portion by one or more second flexible members, the one or more second flexible members each having a curved-shape, wherein each of the one or more first flexible members and the one or more second flexible members have a lower modulus of elasticity than the first side portion, the second side portion, and the center frame portion.

13. The window clamp of claim 12 wherein the one or more first flexible members and the one or more second flexible members allow elastic movement of the center frame portion in X, Y, and Z directions independent of movement of the first side portion and the second side portion.

14. The window clamp of claim 12 wherein adjacent corners of the first side portion and the center frame portion are not coupled, and adjacent corners of the second side portion and the center frame portion are not coupled.

15. The window clamp of claim 12 wherein a thickness of the one or more first flexible members is the same as a thickness of the first side portion, and a thickness of the one or more second flexible members is the same as a thickness of the second side portion.

16. The window clamp of claim 12 wherein a thickness of the one or more first flexible members is less than a thickness of the first side portion, and a thickness of the one or more second flexible members is less than a thickness of the second side portion.

17. A window clamp for holding a leadframe during a wirebonding process, comprising:
   a center frame portion having a top surface, a bottom surface, and an outer edge, the outer edge extending between the top surface and the bottom surface and around a circumference of the center frame portion, wherein a plurality of windows extend from the top surface to the bottom surface through the center frame portion, and each of the plurality of windows are surrounded by an inner edge of the center frame portion;
   side portions each having a top surface, a bottom surface, and a side surface, and each of the side portions disposed on an opposing side of the center frame portion;
   flexible members extending between the side surface of each side portion and the outer edge of the center frame portion so that the flexible members fully isolate the side portions from the center frame portion, the flexible members allowing movement of the center frame portion independent of movement of the side portions when the side portions are in contact with a clamping plate exerting a force on the side portions.

18. The window clamp of claim 17 wherein the flexible members allow movement of the center frame portion in X, Y, and Z directions independent of movement of the side portions.

19. The window clamp of claim 17 wherein the flexible members have a lower modulus of elasticity than either of the side portions or the center frame portion.

20. The window clamp of claim 17 wherein a thickness of the flexible members is the same as a thickness of the side portions.

* * * * *